(12) United States Patent
Jensen

(10) Patent No.: US 6,870,492 B1
(45) Date of Patent: Mar. 22, 2005

(54) METHOD OF NEAR-UNITY FRACTIONAL SAMPLING RATE ALTERATION FOR HIGH FIDELITY DIGITAL AUDIO

(75) Inventor: Henrik T. Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/821,056

(22) Filed: Apr. 8, 2004

(51) Int. Cl.[7] .............................................. H03M 7/00
(52) U.S. Cl. ......................... 341/61; 341/54; 341/123; 708/313
(58) Field of Search ............................ 341/54, 61, 123, 341/143; 708/290, 313

(56) References Cited

U.S. PATENT DOCUMENTS

| | | | | |
|---|---|---|---|---|
| 5,119,093 A | * | 6/1992 | Vogt et al. ................... | 341/123 |
| 5,398,029 A | * | 3/1995 | Toyama et al. ............... | 341/61 |
| 5,446,398 A | * | 8/1995 | Iwata .......................... | 327/113 |
| 5,621,404 A | * | 4/1997 | Heiss et al. ................... | 341/61 |
| 5,903,482 A | * | 5/1999 | Iwamura et al. ............. | 708/313 |
| 6,061,704 A | * | 5/2000 | Ostman et al. ............. | 708/313 |
| 6,462,682 B2 | * | 10/2002 | Hellberg ..................... | 341/61 |
| 6,473,475 B1 | * | 10/2002 | Putzeys ...................... | 375/350 |
| 6,512,468 B1 | * | 1/2003 | Zhong ........................ | 341/61 |

* cited by examiner

*Primary Examiner*—Michael Tokar
*Assistant Examiner*—Khai Nguyen
(74) *Attorney, Agent, or Firm*—Garlick Harrison & Markison, LLP; James A. Harrison

(57) ABSTRACT

The present invention provides an efficient method for near-unity sampling rate alteration in high performance applications, such as CD to DAT conversion. Specifically, the input digital signal is first interpolated by a factor of eight and lowpass filtered to form an intermediate signal. A clamped cubic spline interpolator (CCSI) algorithm is then employed to accurately interpolate the intermediate signal to points in-between adjacent samples of the intermediate signal as required by the 48 kHz output sampling rate. The CCSI is highly accurate due to highly accurate derivative estimates arrived at by repeated Richardson extrapolation. In the example CD to DAT converter covered in detail, fourth order Richardson extrapolation is employed. It is shown by this example that the proposed method yields the desired performance, is computationally efficient and requires little storage.

30 Claims, 16 Drawing Sheets

Typical architecture of the sampling rate converter in accordance with the present invention.

Top level functional block diagram of the CCSI.

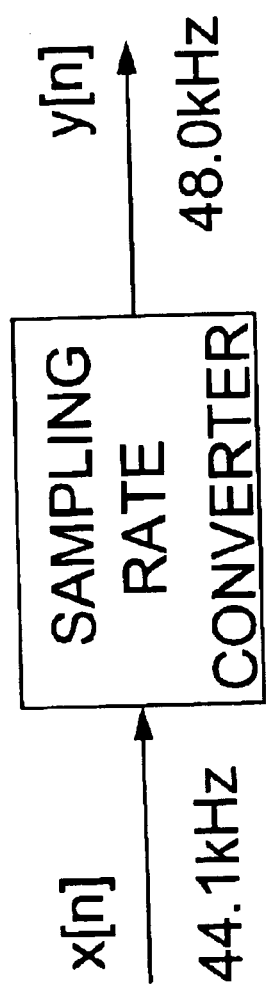
Figure 1: Top-level block diagram of the all-digital sampling rate converter when applied to "CD to DAT" conversion.
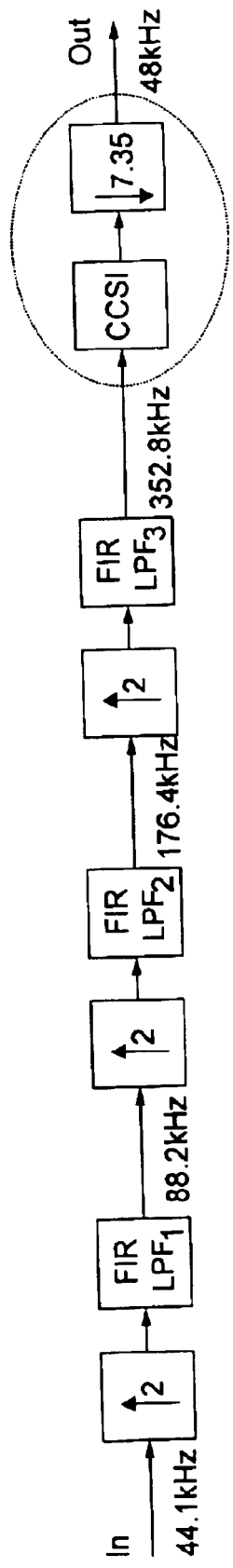
Figure 3: Typical architecture of the sampling rate converter in accordance with the present invention.

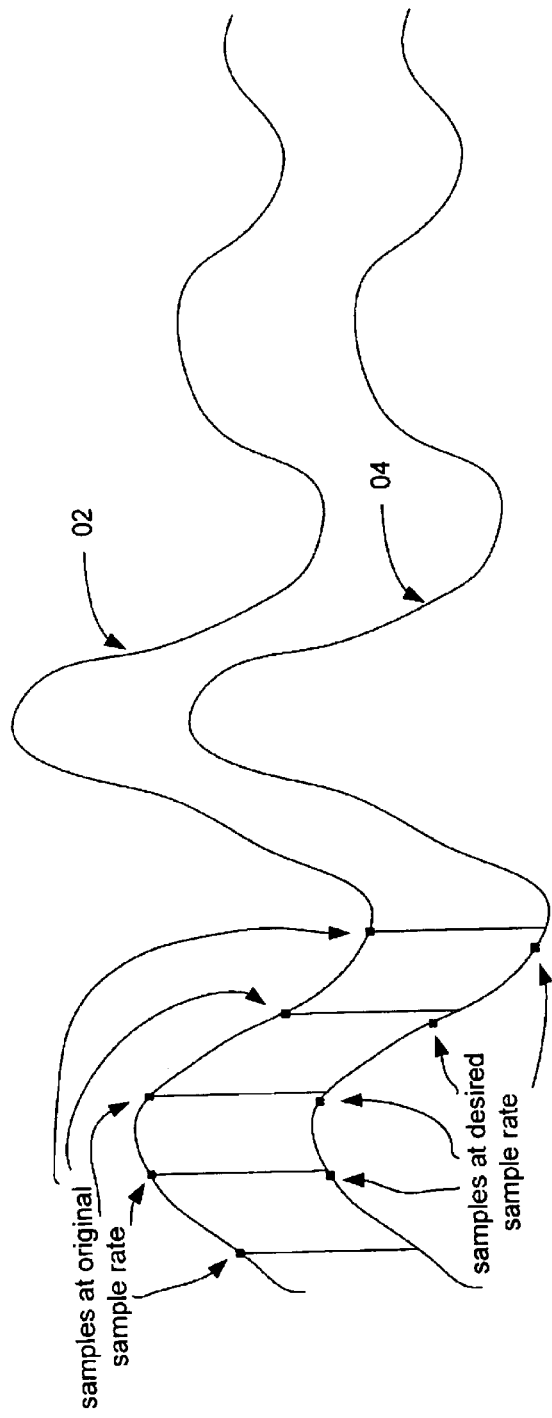
FIG. 2A: Sampling of an example signal
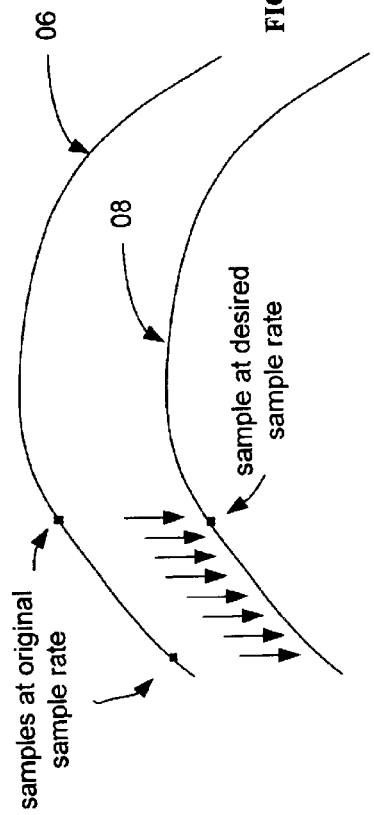
FIG. 2B: Upsampling of an example signal

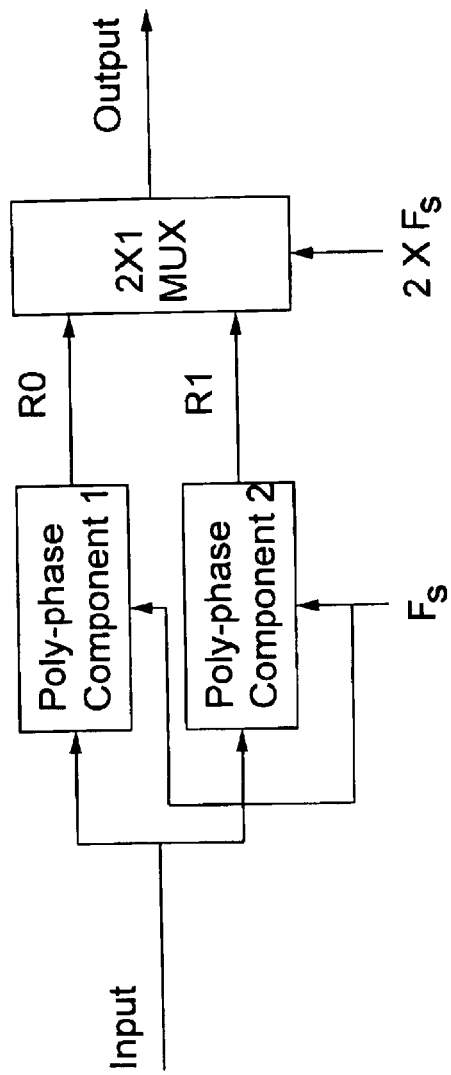
Figure 4: Top level structure of poly-phase implementation of each of the interpolation filters.
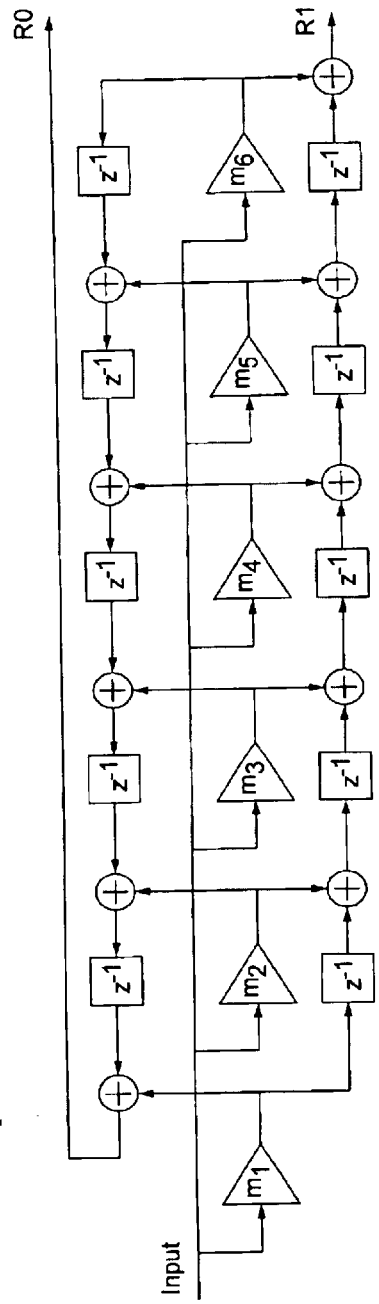
Figure 5: Poly-phase implementation of LPF$_3$.

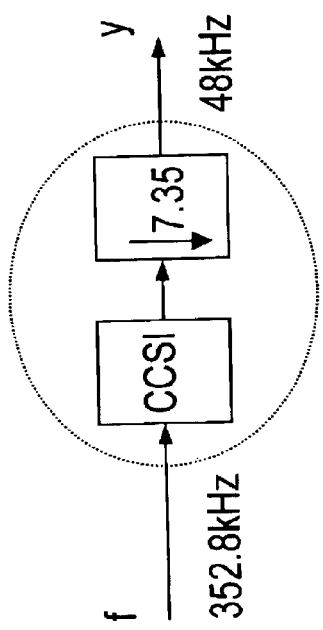
Figure 6: Top level diagram of the Clamped Cubic Spline Interpolator (CCSI) of Figure 3.
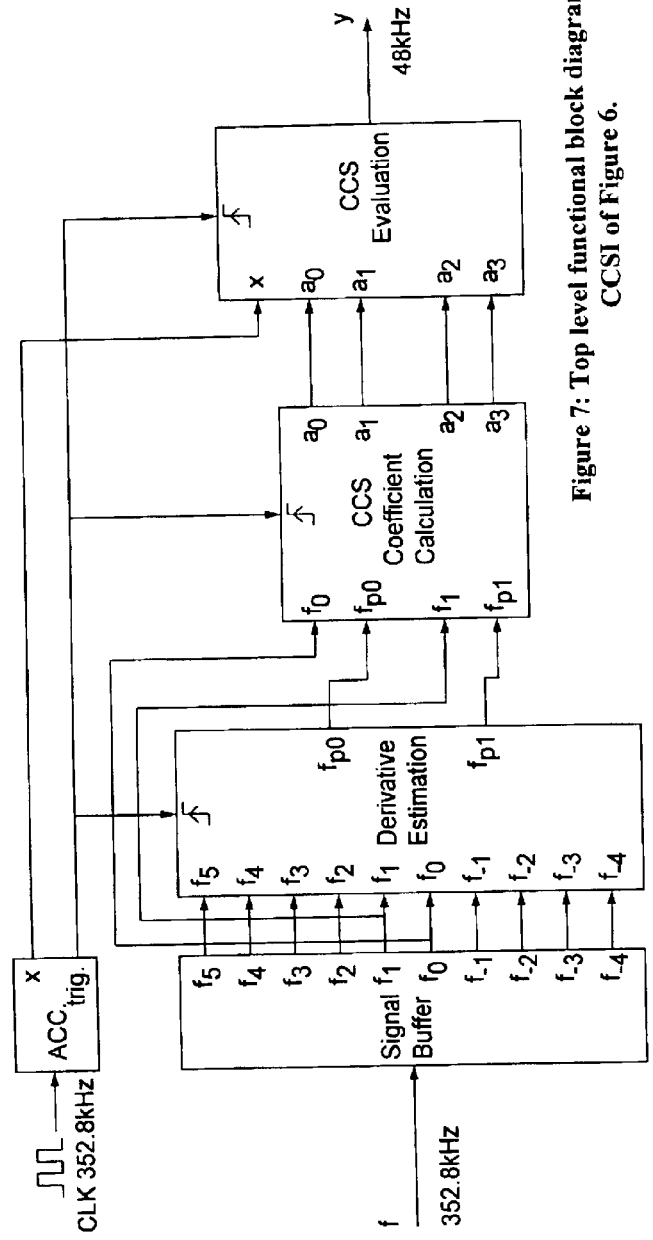
Figure 7: Top level functional block diagram of the CCSI of Figure 6.

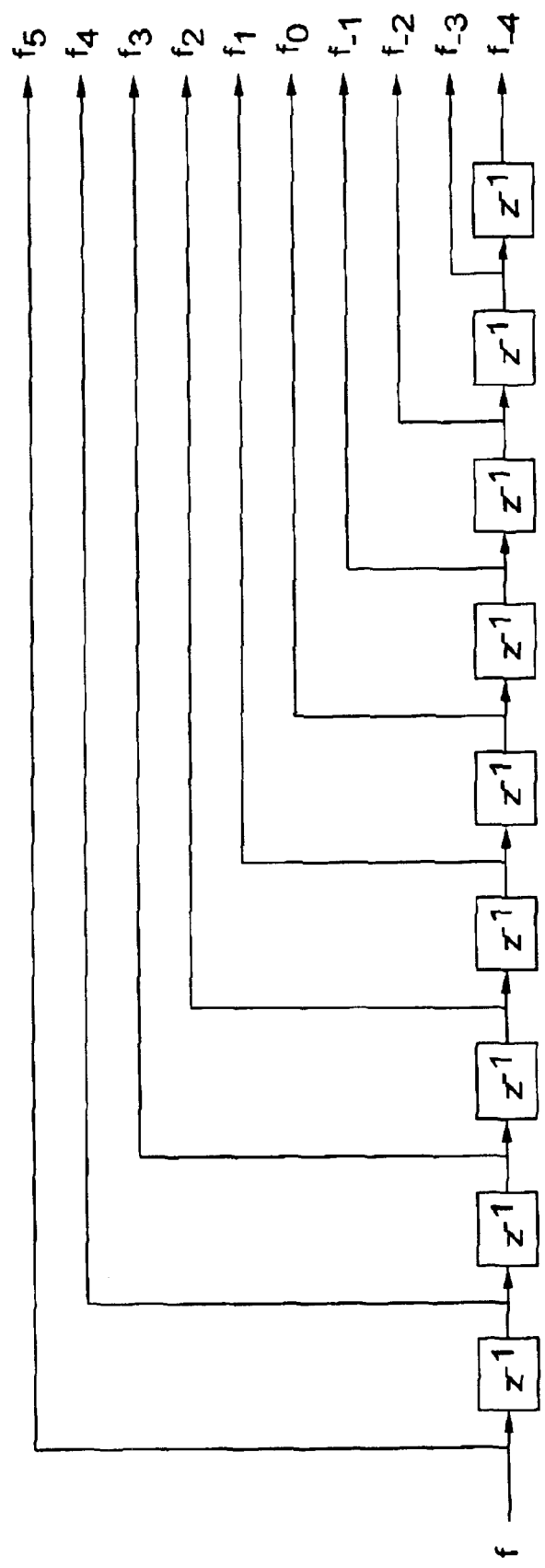
Figure 8: Details of the "Signal Buffer" block of Figure 7.

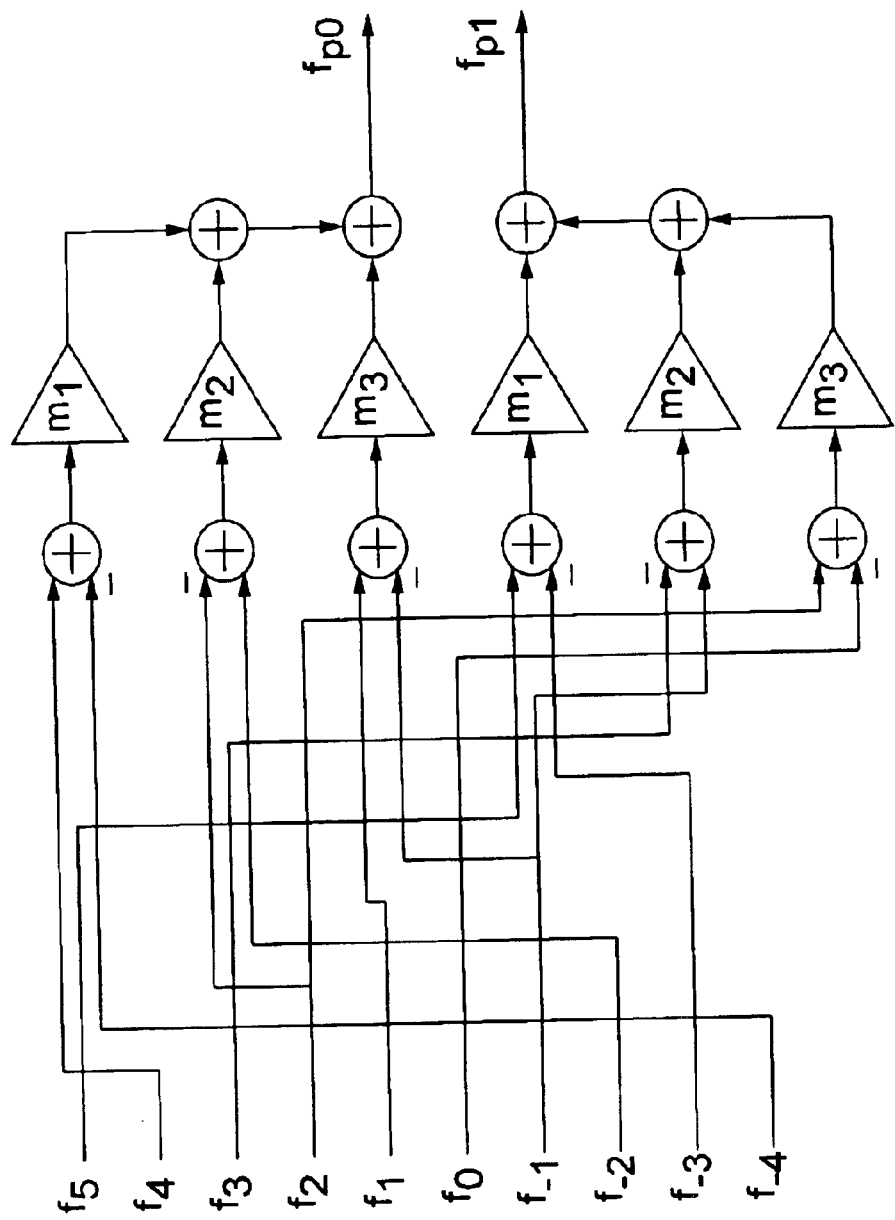
Figure 9: Details of the "Derivative Estimation" block of Figure 7

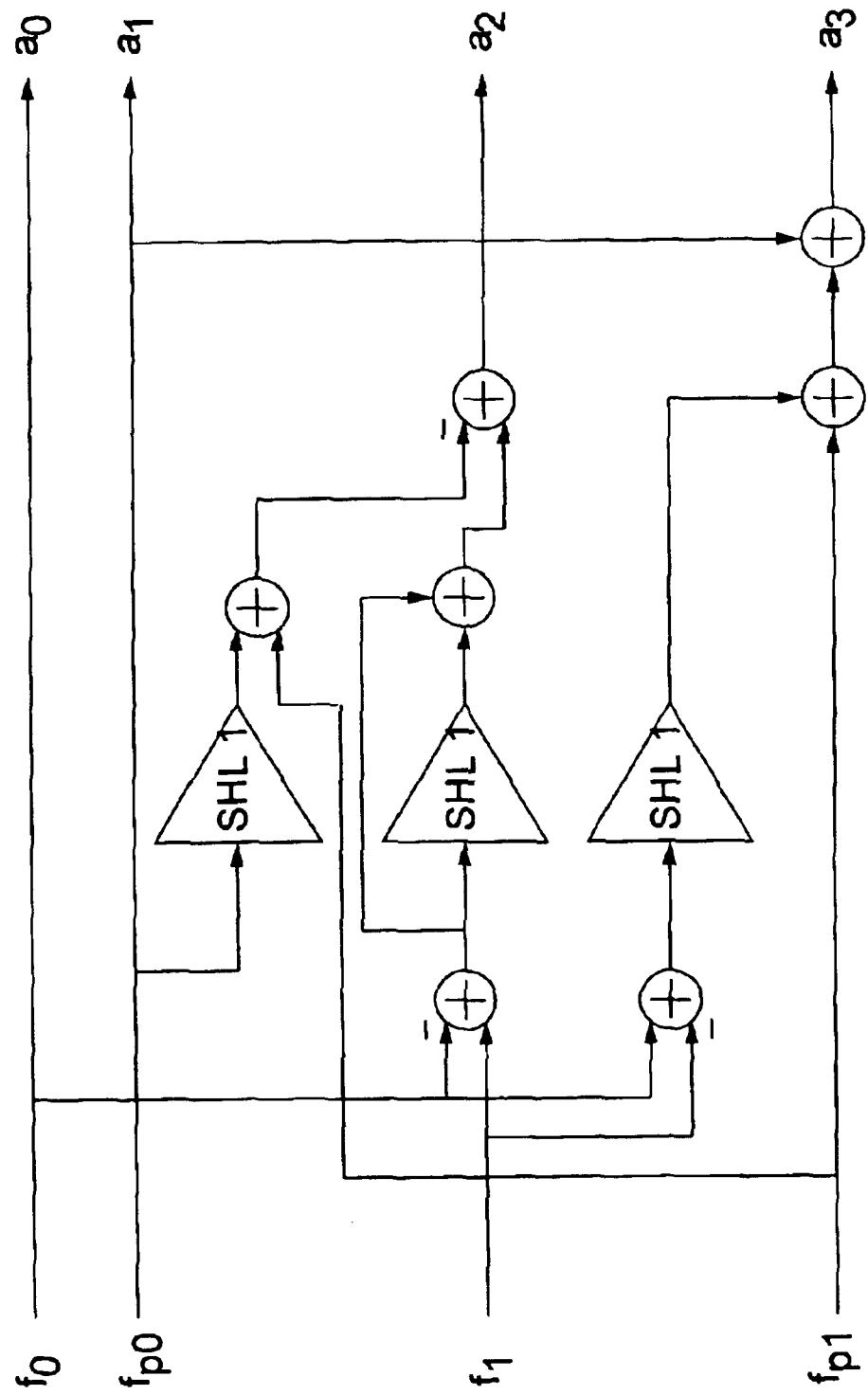
Figure 10: Details of the "CCS Coefficient Calculation" block of Figure 7.

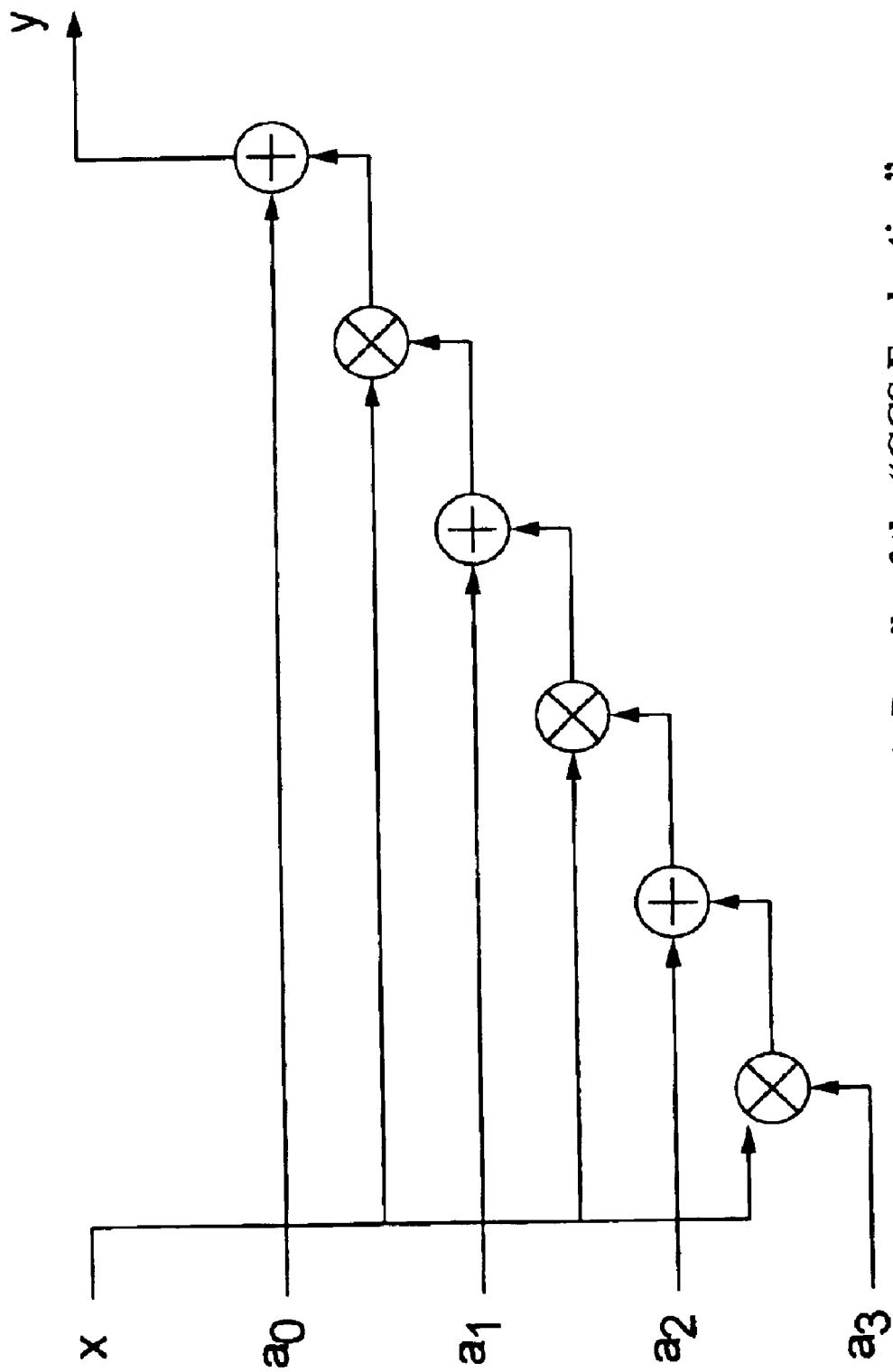
Figure 11: Details of the "CCS Evaluation" block of Figure 7

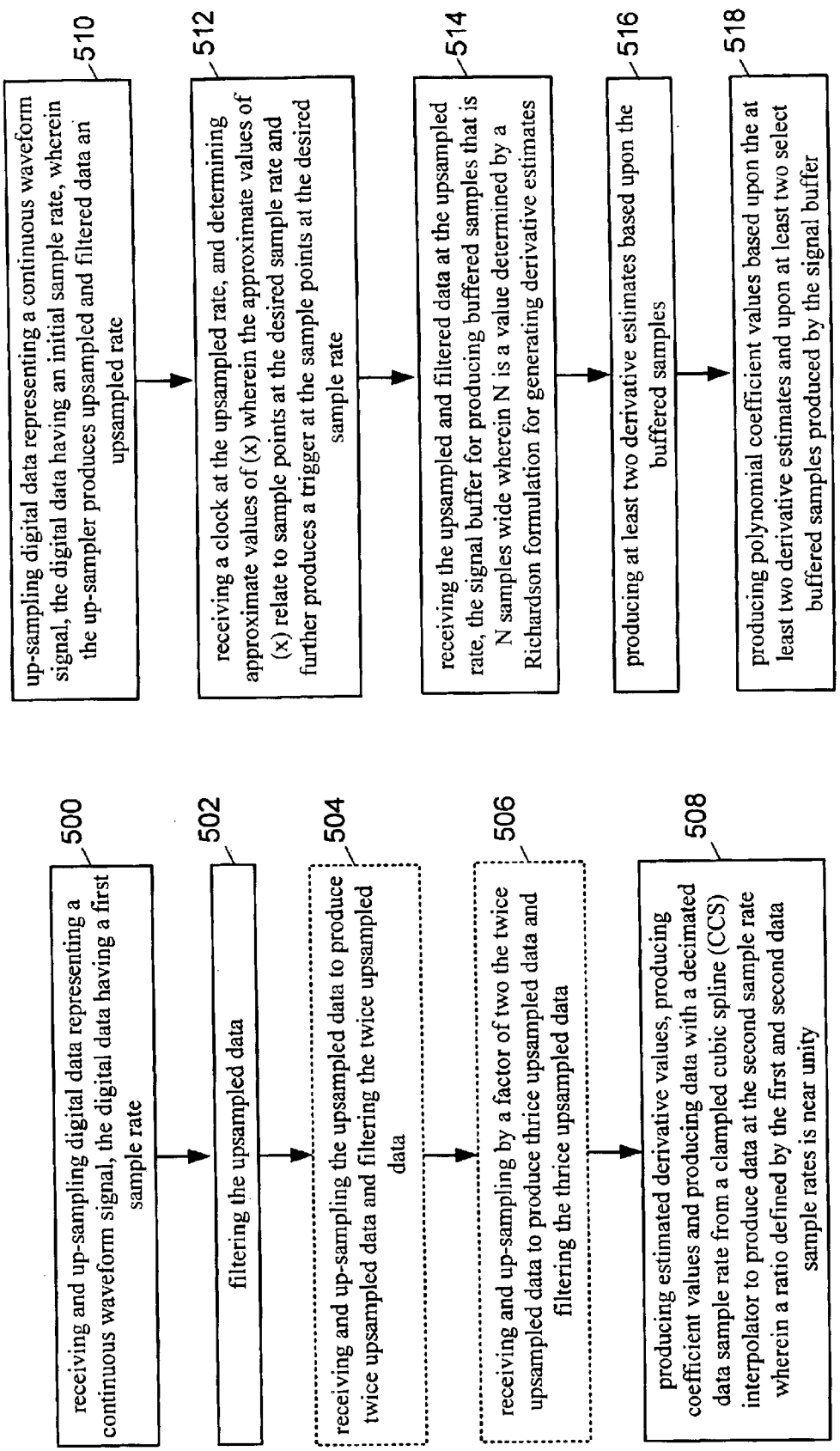
FIG 12B: Method for determining coefficient values as a part of performing near unity sample rate conversion
FIG 12A: Method for near unity sample rate conversion

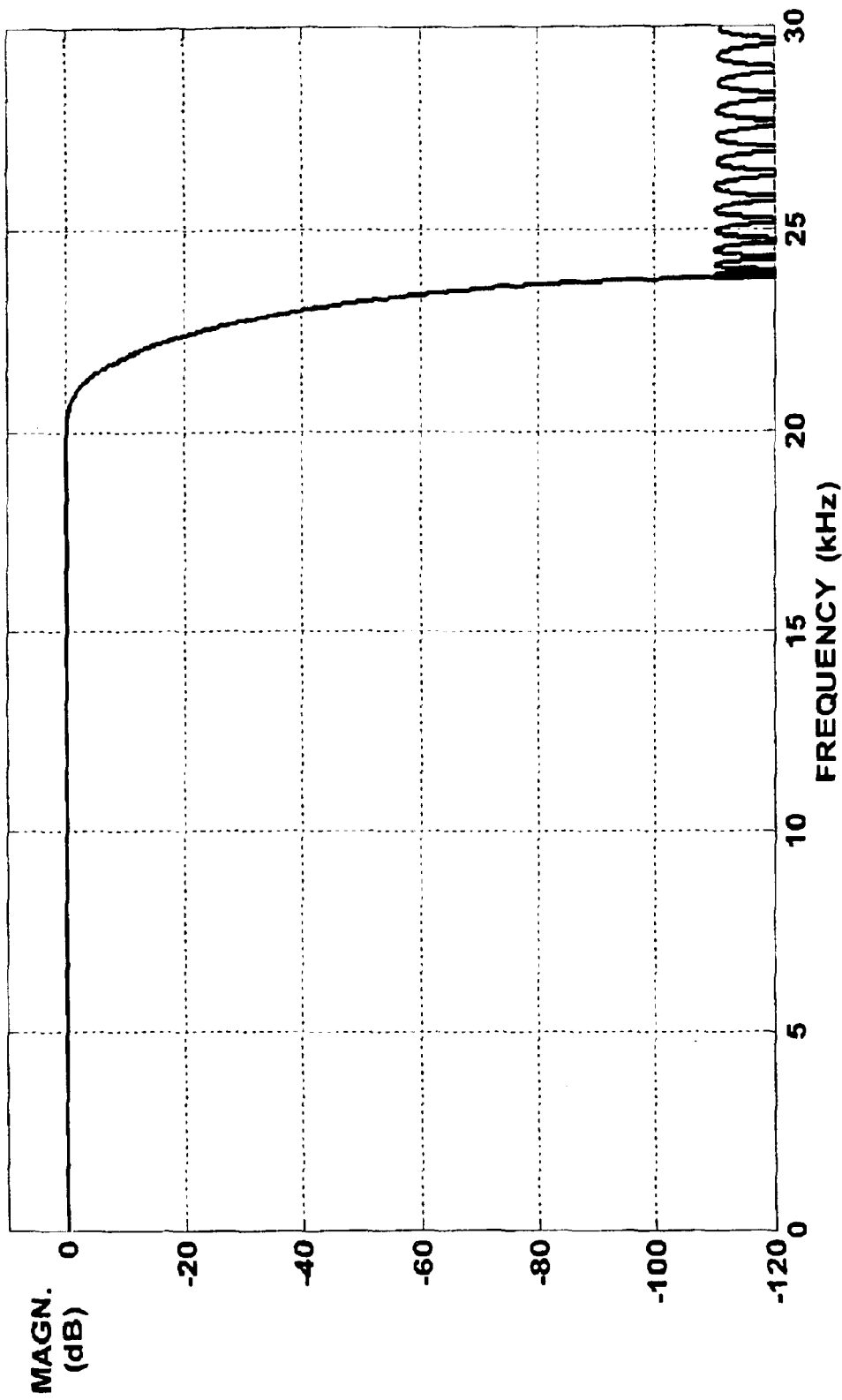
Figure 13: Magnitude response of the CD to DAT converter

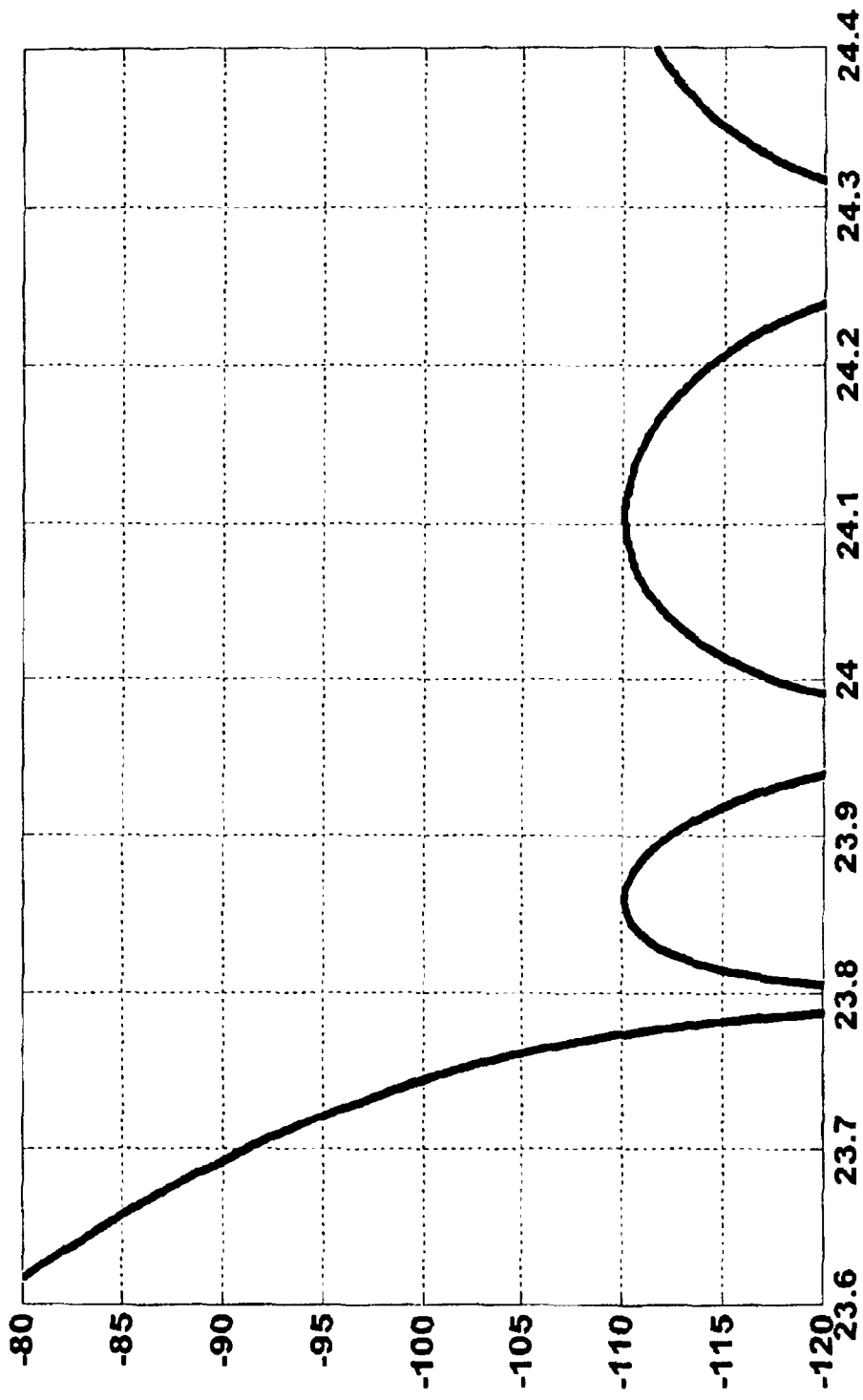
Figure 14: Close-up of the magnitude response shown in Figure 13

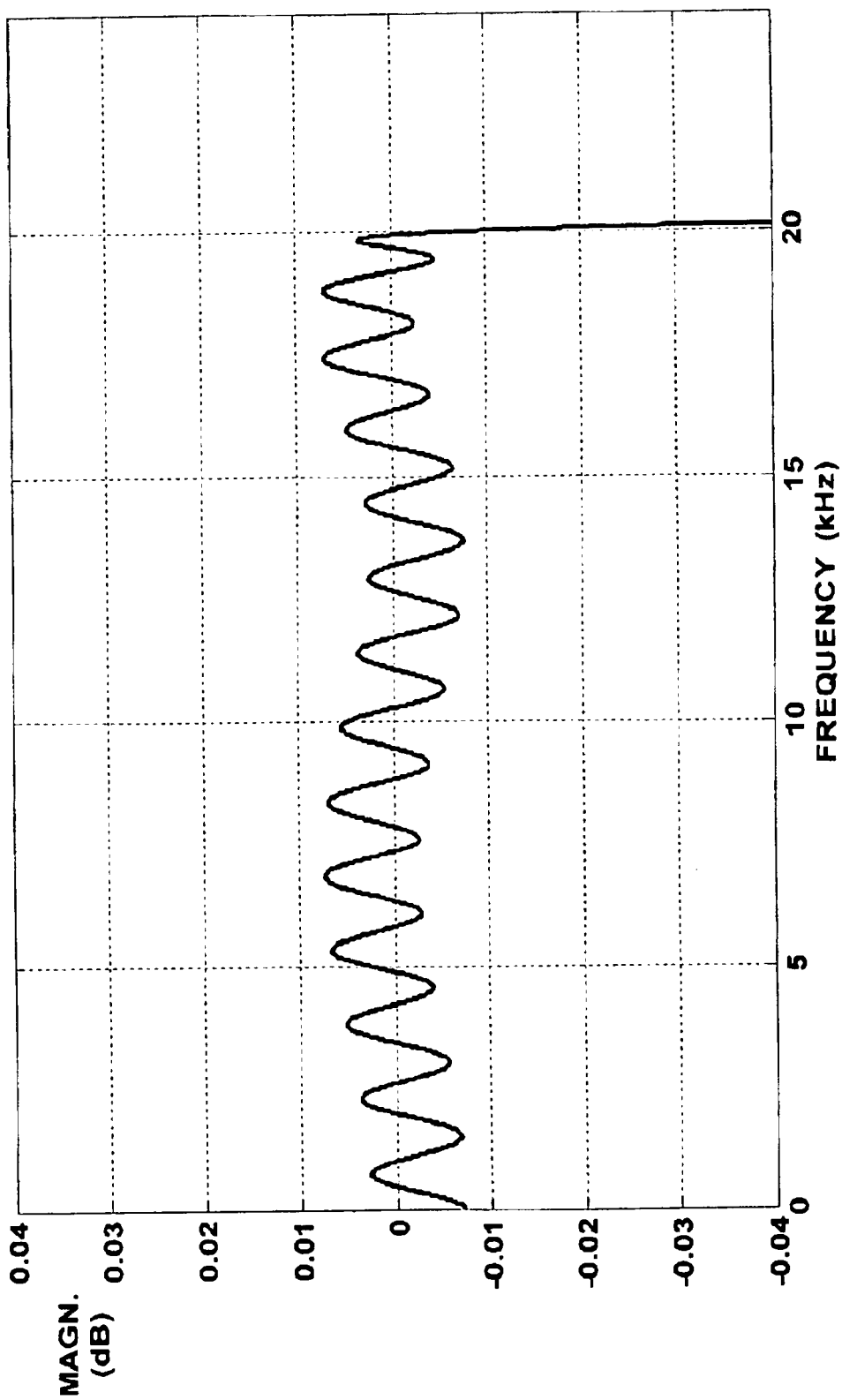
Figure 15: Typical in-band ripple of the interpolator magnitude response

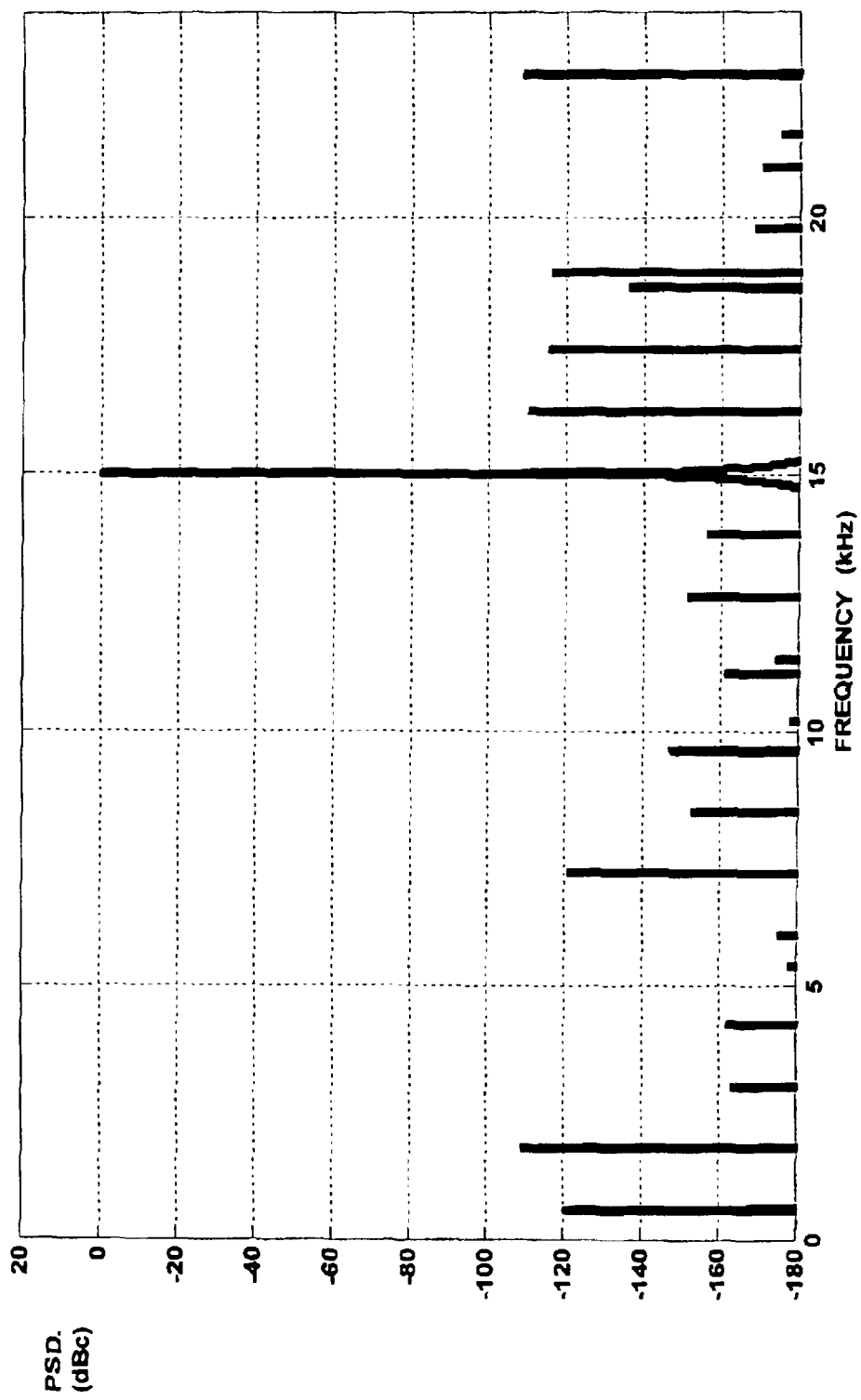
Figure 16: Typical output power spectral density of the sampling rate converter

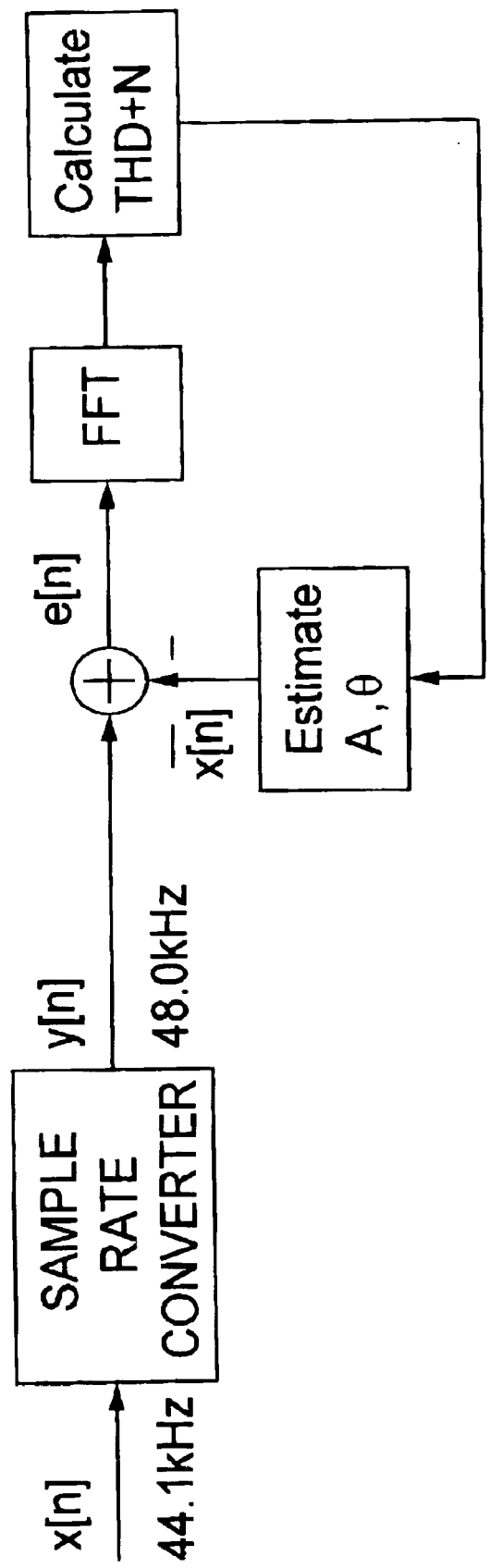
Figure 17: Scheme for calculating SNDR and SFDR via simulation

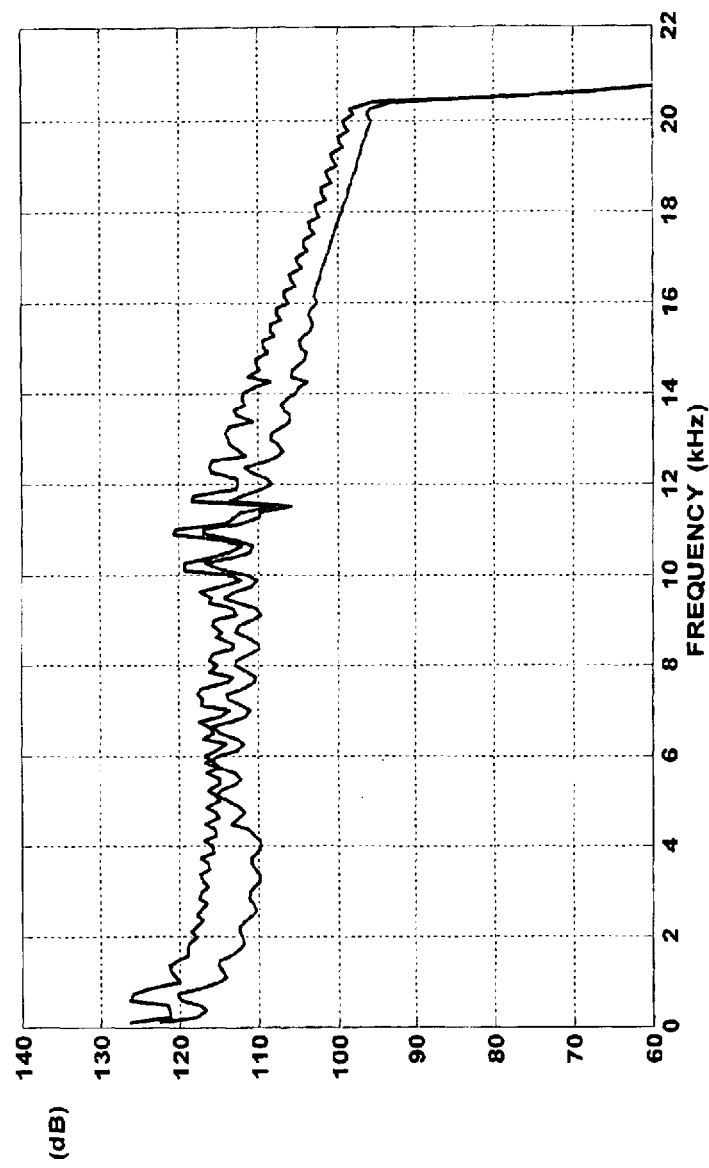
*Figure 18:* Simulated spurious-free dynamic range (SFDR) (blue) and signal-to-noise-and-distortion ratio (SNDR) (red) vs. frequency of the sampling rate converter output.

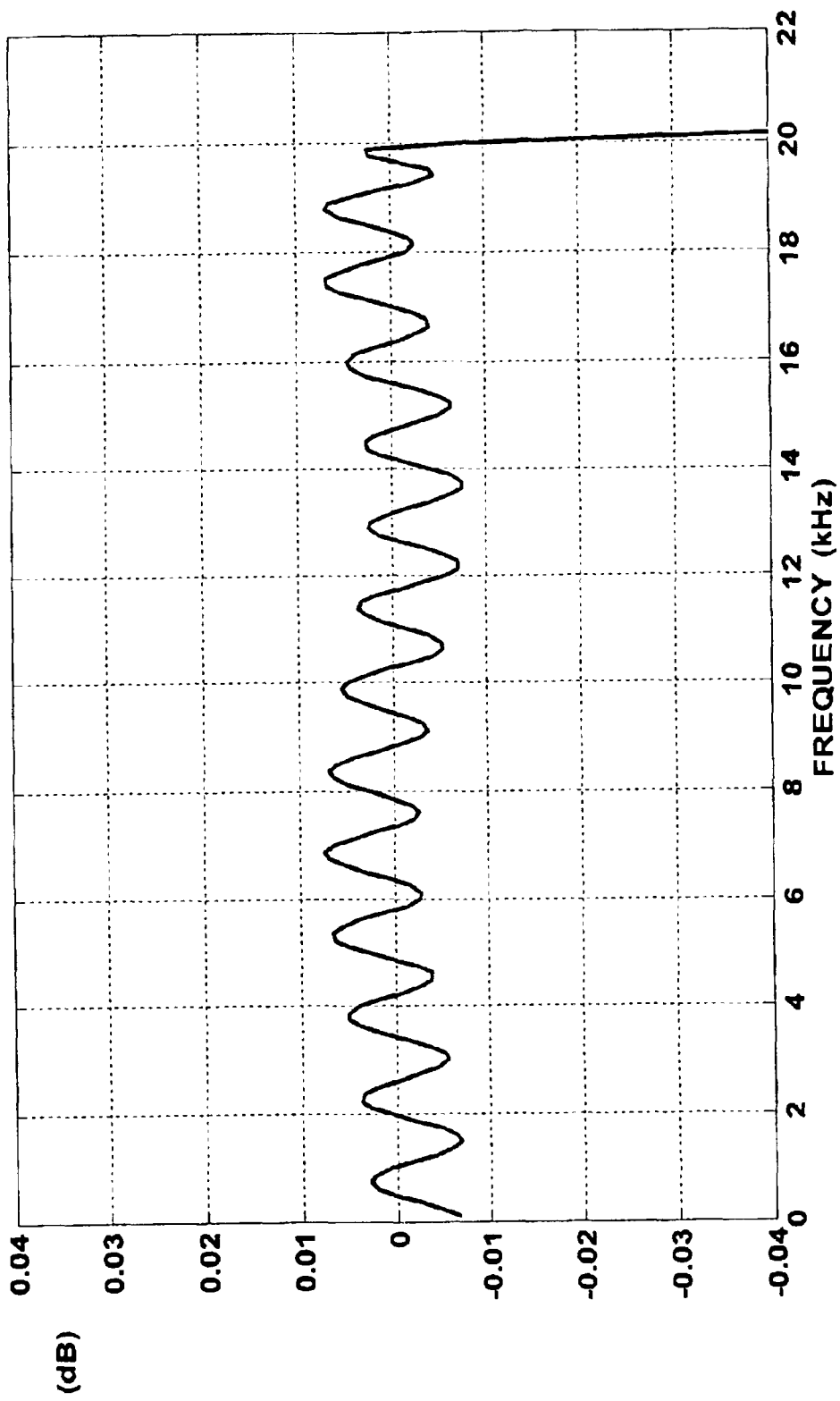
Figure 19: Simulated magnitude response of the sampling rate converter.

METHOD OF NEAR-UNITY FRACTIONAL SAMPLING RATE ALTERATION FOR HIGH FIDELITY DIGITAL AUDIO

BACKGROUND

1. Technical Field

The present invention relates to high fidelity audio systems and, more particularly, high fidelity digital audio systems that require sampling rate modification.

2. Related Art

There exist different sampling rate conversion algorithms to alter the sampling rate of a signal from one sampling rate, $f_1$, to another sampling rate, $f_2$. Typically, it is essential to change between two different sampling rates without degrading any of the useful information in the original digital signal. Several techniques are used traditionally. The conceptually simplest method involves converting the digital signal sampled at the rate $f_1$ into an analog signal using an accurate digital-to-analog converter (DAC). The resulting analog signal is lowpass filtered to remove digital images and then sampled at the rate $f_2$ using an accurate analog-to-digital converter (ADC). While conceptually simple, the harmonics and noise distortion occurring in the conversion between the analog and digital domains degrades the quality of the resulting signal to a degree that renders the method unusable for high fidelity applications such as digital stereo audio.

A conventional multi-rate technique has been popularly employed for digital sampling rate conversion for a fixed ratio M/N, where M and N are positive integers. This method is only effective when M/N is quite large or small; for M/N≈1, a task referred to as "near-unity fractional sampling rate alteration", the method demands excessive computational complexity. For example, a task of primary focus for the present invention is the conversion of digital audio between the sampling rates of $f_1$=44.1 kHz and $f_2$=48 kHz, a task commonly referred to as "compact disk (CD) to digital audio tape (DAT) conversion", as shown in FIG. 1. Expressed as a ratio of integers, M/N=160/147, or, M/N≈1.088. The input signal is first up-sampled by a factor 160, then passed through a sharp digital lowpass filter, and finally decimated by a factor 147. Implementing a 160-fold interpolation for digital audio requires a computationally very complex digital algorithm and this method is thus undesirable for CD to DAT conversion.

What is needed, therefore, is a method and an apparatus that addresses the problem of efficiently altering the sampling rate of a high fidelity digital signal, such as digital audio, between two sampling rates that are only slightly different.

SUMMARY OF THE INVENTION

The present invention provides an efficient method for near-unity sampling rate alteration in high performance applications, such as CD to DAT conversion. Specifically, the input digital signal is first interpolated (up-sampled) by a factor 8 and lowpass filtered to form an intermediate signal. The up-sampled signal is then decimated by a factor of 7.35 in the described embodiment of the invention. Circuitry that implements a clamped cubic spline interpolator (CCSI) algorithm is then employed to accurately interpolate the intermediate signal to points in-between adjacent samples of the intermediate signal as required by the 48 kHz output sampling rate. The CCSI is highly accurate due to highly accurate derivative estimates arrived at by repeated Richardson extrapolation. In the example CD to DAT converter covered in detail, fourth order Richardson extrapolation is employed. It is shown by this example that the proposed method yields the desired performance, is computationally efficient and requires little storage.

More specifically, a sampling rate converter for altering an initial sampling rate to a desired sampling rate resulting in near-unity fractional sampling rate alteration includes an interpolator for receiving and up-sampling digital data representing a continuous waveform signal. The interpolator produces upsampled and filtered data at an upsampled rate relative to an initial digital data sampling rate. An accumulator that receives a clock at the upsampled rate determines approximate values of time, x, that relate to sampling points at the desired sampling rate and produces a trigger at the sampling points at the desired sampling rate. Thus, the circuitry produces a function value (signal magnitude) whenever the trigger is generated.

A signal buffer receives the upsampled and filtered data at the upsampled rate and produces buffered samples that are N samples wide wherein N is a value determined by a Richardson formulation for generating derivative estimates. A derivative estimation block receives the buffered samples and produces at least two derivative estimates based upon the buffered samples. A coefficient calculation block then produces two polynomial coefficient values based upon the at least two derivative estimates produced by the derivative estimation block and also based upon at least two select buffered samples produced by the signal buffer. Finally, a polynomial evaluation block for producing a function value representing an estimated sampling point value produces the function value (estimated signal magnitude) based upon the polynomial coefficient values and the approximate value of (x). The derivative estimation block, the coefficient calculation block and the polynomial evaluation block produce outputs based upon the trigger produced by the accumulator. The trigger represents a sampling point at the desired sampling rate.

More generally, the above described circuitry, in the described embodiment, includes an interpolator that up samples the digital data eight times and a clamped cubic spline interpolator that decimates the upsampled data by a factor of 7.35. Accordingly, a hi-fidelity signal having a 44.1 kHz sampling rate may be converted to the same signal having a 48 kHz sampling rate in a real time basis for hi-fidelity applications.

BRIEF DESCRIPTION OF THE DRAWINGS

A better understanding of the present invention can be obtained when the following detailed description of the preferred embodiment is considered with the following drawings, in which.

FIG. 1 is a functional block diagram of a sampling rate converter according to one embodiment of the present invention;

FIGS. 2A and 2B are signal illustrations that illustrate sampling and upsampling of an example signal and one problem addressed by the present invention;

FIG. 3 shows a top level block diagram of the present invention for application in CD to DAT conversion;

FIG. 4 shows the two-fold interpolation filters implemented in poly-phase form;

FIG. 5 shows an example implementation of $LPF_3$ in poly-phase form;

FIG. 6 shows the top level block diagram of the CCSI block; the intermediate signal, f, with sampling rate 352.8 kHz enters the block and it generates output samples at a rate of 48 kHz;

FIG. 7 is a functional block diagram that illustrates a clamped cubic spline interpolator formed according one embodiment of the present invention;

FIG. 8 is a block diagram of the "Signal Buffer" appropriate for calculating derivative estimates using fourth order Richardson extrapolation according to one embodiment of the present invention;

FIG. 9 is a functional block diagram of the derivative estimation block according one embodiment of the invention;

FIG. 10 is a functional block diagram of the CCS coefficient calculation block that shows the details of the calculation of the CCS coefficients according one embodiment of the invention;

FIG. 11 shows the details of the CCS evaluation block of FIG. 7;

FIGS. 12A and 12B are flow charts of a method of the present invention;

FIG. 13 shows the magnitude response in dB of the sampling rate converter in the frequency range 0–30 kHz;

FIG. 14 shows a close-up of FIG. 13;

FIG. 15 shows the typical ripple of the passband magnitude response;

FIG. 16 shows a typical simulation result for one embodiment of the present invention;

FIG. 17 shows a block diagram of the scheme employed to evaluate the SNDR and SFDR;

FIG. 18 shows simulated SNDR and SFDR vs. frequency of the sinusoidal input signal; and FIG. 19 shows the simulated magnitude response of the sampling rate converter found as the ratio of output signal amplitude and input signal amplitude.

DETAILED DESCRIPTION OF THE DRAWINGS

FIG. 1 is a functional block diagram of a sampling rate converter according to one embodiment of the present invention. In the described embodiment, the sampling rate converter of FIG. 1 is used to convert a high fidelity audio signal with a sampling rate of 44.1 kHz to the same high fidelity audio signal with a sampling rate of 48.0 kHz. It is understood, of course, that the inventive approach may be used for other near-unity sampling rate conversion applications. Generally, converting from a first to a second sampling rate defined by a ratio of two or more is a relatively easy task. For example, one may readily convert by integer amounts merely by upsampling and lowpass filtering at a higher rate in a digital processor. As stated before, however, converting between nearly identical sampling rates by integer interpolation followed by integer decimation is a more complex conversion. Such complex computational approaches are satisfactory for some circumstances, but are not satisfactory for real-time high fidelity applications. In the described embodiment of FIG. 1, sampling at a 44.1 kHz sampling rate yields a signal that ranges from 0 to 22.05 kHz having a mirror image that ranges from 22.05 to 44.1 kHz. Because hearing range for high fidelity applications is from 0 to 20 kHz, the sampling rate of 44.1 kHz is adequate for high fidelity applications. One problem, however, is that different protocol devices sample at different rates though approximately at the same rate. For example, compact disc players typically sample at 44.1 kHz, while other digital applications sample at, for example, 48.0 kHz. Accordingly, to convert from a CD to a DAT requires near-unity sampling rate conversion.

Table 1 below gives additional typical performance requirement details of the sampling rate alteration process. Many of these requirements are discussed further in the subsequent sections of this disclosure, but the following is a brief summary of the requirements. Specifically, the signal passband is the frequency range 0–20 kHz. The ripple (variation) of the sampling rate converter magnitude response over the signal passband is limited to 0.01 dB. The phase response over the signal passband is required to be linear. The transition band, i.e., the region between the upper passband frequency and the lower stopband frequency is the frequency range 20 kHz–24 kHz. The required stopband attenuation is specified to be at least 110 dB. For signals in the specified passband, a minimum of 96 dB signal-to-noise-and-distortion ratio (SNDR) should be provided, with a minimum of 100 dB spurious-free dynamic range (SFDR).

TABLE 1

Typical specifications for the
"CD to DAT" sampling rate converter

| | |
|---|---|
| Input Sampling Rate | 44.1 kHz |
| Output Sampling Rate | 48.0 kHz |
| Passband | 0–20 kHz |
| Passband Magnitude Ripple | <0.01 dB |
| Phase Response | Linear |
| Transition Band | 20 kHz–24 kHz |
| Stopband Attenuation | >110 dB |
| SNDR | >96 dB |
| SFDR | >100 dB |

FIGS. 2A and 2B are signal illustrations that show sampling and upsampling of an example signal and one problem addressed by the present invention. Referring to FIG. 2A, a random signal 02 is shown for which samples are taken at a specified sampling rate. As may be seen, random signal 02 is shown to be sampled 5 times at a specified sampling rate. A signal 04, which is a copy of signal 02, is shown below signal 02 with sampling points for a slightly higher sampling rate. As may be seen, the samples at the desired sampling rate of the signal 04 precede the samples at the original sampling rate by increasing amounts. If the desired sampling rate were merely an integer multiple of the original sampling rate, the problem would be straight-forward. Merely increasing the upsample rate followed by appropriate lowpass filtering would result in samples being taken at the desired sampling rate. However, as may be seen, for near-unity sampling rate conversions, an approach for converting from an original sampling rate to a desired sampling rate is not as simple.

Referring now to FIG. 2B, it may be seen that merely upsampling the original sampling rate may not be adequate. As may be seen, two sampling points are shown on a signal 06. On a signal 08, which is a copy of signal 06, the original sampling rate has been increased by a factor of 8. The sampling point on signal 08, however, still resides between the last two sampling points at the upsampled sampling rate. Accordingly, determining a signal magnitude of signal 08 at the desired sampling point resulting from the desired sampling rate is not readily obtained merely by increasing a sampling rate, even by a significant increase in rate such as suggested in FIG. 2B.

As will be described in greater detail below, however, the invention takes advantage of the fact that increasing a sampling rate by a factor, for example 8 times, creates sampling points sufficiently close to a sampling point of a desired sampling rate, as shown in FIG. 2B for the signal 08, that using the inventive techniques disclosed herein, the actual signal magnitude for the signal shown as a copy of signal 04 may readily be obtained with a high degree of accuracy.

FIG. 3 shows a top level block diagram of the present invention for application in CD to DAT conversion. It consists of three 2-fold interpolation filters to increase the sampling rate to 44.1×2³ kHz=352.8 kHz. Each interpolation stage conceptually consists of a block that increases the sampling rate 2-fold (the block labeled "↑2") and then lowpass filters the resulting signal (the block labeled LPF) to eliminate images resulting from the increase in sampling rate. For the example sampling rate converter, $LPF_1$ is of order 119, $LPF_2$ is of order 17, and $LPF_3$ is of order 11. The final output samples must be calculated by interpolating in-between the samples of the intermediate signal with sampling rate 352.8 kHz, as dictated by the desired 48 kHz output sampling rate. As shown in FIG. 3, this task is performed by a block referred to as "CCSI", the clamped cubic spline interpolator.

The clamped cubic spline interpolator that decimates the upsampled sampling rate by a factor of 7.35 to produce a 48 kHz sampling data stream includes circuitry for implementing a plurality of algorithms in hardware to achieve the desired result. As was described above in relation to FIG. 2B, the clamped cubic spline interpolator is required to highly accurately determine a signal magnitude (or function) value at a sampling point defined by the decimated sampling rate. One approach for achieving the overall result that is provided by the architecture of FIG. 3 is to upsample by a factor of 160 and to decimate a factor of 147. This approach is computationally complex and time-consuming and is not satisfactory for real-time high fidelity applications. Upsampling by a factor of 8, interpolating using the CCSI algorithm, and decimating by a factor 7.35, as shown in the architecture of FIG. 3, satisfactorily achieves signal-to-noise and distortion ratio (SNDR) requirements. The problem, then, is decimating by a factor of 7.35, which is the function of the clamped cubic spline interpolator. As an additional point, it would be straight-forward to merely upsample the original signal by a factor of 8. One drawback with that approach, however, is that a filter would have to be designed to have a much sharper response to satisfactorily remove all images resulting from the upsampling. Accordingly, upsampling occurs in three stages, wherein the sampling rate is doubled each of three times, and is then filtered by a digital finite impulse response (FIR) filter.

The sampling rate converter of FIG. 3 performs a Taylor expansion and a Richardson extrapolation to get highly accurate derivative values for the two upsampled sampling points that appear about the sampling point of the desired sampling rate. As will be described in greater detail below, determining the derivatives of the function, in an accurate but approximate manner, facilitates approximating the function to determine an accurate function value for a specified sampling point at the desired sampling rate. More specifically, the estimates of the derivative values may be used to determine coefficients of a cubic polynomial function that is used to describe the unknown signal.

To reduce the overall number of multiplications and additions required per unit time, the LPFs are all implemented in poly-phase form. As indicated in FIG. 4, two-fold interpolation filters implemented in poly-phase form consists of two sub-components, referred to as "poly-phase components", operating at the low sampling rate followed by a MUX that selects between the poly-phase component outputs. The MUX operates at the high sampling rate. FIG. 5 shows an example implementation of $LPF_3$ in poly-phase form. The outputs R0 and R1 correspond to poly-phase components 1 and 2, respectively of FIG. 4.

FIG. 6 shows the top level block diagram of the CCSI block; the intermediate signal, f, with sampling rate 352.8 kHz enters the block and it generates output samples at a rate of 48 kHz.

FIG. 7 is a functional block diagram that illustrates a clamped cubic spline interpolator formed according one embodiment of the present invention. The clamped cubic spline interpolator (CCSI) of FIG. 7 includes a "Signal Buffer" block, an accumulator block, "ACC", a "Derivative Estimation" block, a "CCS Coefficient Calculation" block, and a "CCS Evaluation" block. The CCSI of FIG. 7 is coupled to receive an upsampled signal that is to be decimated by a specified non-integer amount. In the specific embodiment shown, the CCSI is coupled to receive a 352.8 kHz signal and to produce a decimated signal having a sampling rate of 48.0 kHz. More specifically, the signal buffer receives the input signal of 352.8 kHz and captures a plurality of samples which it produces in parallel. More specifically, the signal buffer captures 10 sequential samples of the 352.8 kHz input signal in the described embodiment of the invention. The signal buffer produces the 10 buffered samples to the derivative estimation block. The signal buffer also produces two select samples to the CCS coefficient calculation block. The derivative estimation block produces two derivative estimates based upon the 10 buffered samples received from the signal buffer. The two derivative estimates produced by the derivative estimation block are produced to the CCS coefficient calculation block. The CCS coefficient calculation block then produces, in the described embodiment, four coefficient values for a cubic polynomial. The four coefficient values are produced to the CCS evaluation block, which is further coupled to receive a value (x) corresponding to a specified decimated sampling point. The CCS evaluation block then produces a function value at the desired sampling rate of 48 kHz. Operation and theory of each of the blocks within FIG. 7 are described in greater detail below.

A clamped cubic spline is a cubic polynomial of the form $$f(x)=a_0+a_1x+a_2x^2+a_3x^3, \quad (1)$$

where the coefficients $a_0, \ldots, a_3$ depend upon known values of the function and its derivatives in the boundary points $x_0$ and $x_1$, and where the interpolation point x (the point at which an estimate of the underlying function is desired) is in-between the boundary points. For convenience, f(x) is defined such that x∈[0; 1]. Specifically, $$a_0=f(x)$$

$$a_1=f'(x_0)$$

$$a_2=3(f(x_1)-f(x_0))-(f'(x_1)+2f'(x_0))$$

$$a_3=2(f(x_0)-f(x_1))+f'(x_1)+f'(x_0) \quad (2)$$

In the present application the signal is generally unknown and hence the derivatives of the signal are not known analytically a-priori. Thus, for high performance applications, precise estimates of the signal derivatives in the boundary points must be generated. The present invention uses Taylor approximation and Richardson extrapolation to arrive at highly precise derivative estimates. Details of the approach are given in a subsequent section.

For discussion of FIG. 7, assume that the block labeled "Derivative Estimation" in FIG. 7 generates precise estimates of the signal derivatives in the boundary points in-between the appropriate samples of the intermediate signal. Specifically, these derivatives are evaluated as $f'(x_0)$ and $f'(x_1)$, and are labeled "fp0" and "fp1", respectively. The "CCS Coefficient Calculation" block then calculates the CCSI coefficients, as defined by (1) and (2). The evaluation of the polynomial corresponding to (1) is performed by the "CCS Evaluation" block. The block labeled "ACC" provides sampling triggers at an average rate of 48 kHz (the desired sampling rate in the described embodiment).

A Richardson extrapolation is performed by the derivative estimation block for producing precise derivative estimates. Richardson extrapolation originates from the field of numerical analysis, where it is used to generate increasingly precise estimates of a function A(h) which depends upon a parameter h. For example, h could be the step size of a method for numerical integration or differentiation. In the following, it will be assumed that $$A(h) \to A \text{ for } h \to 0.$$

Furthermore, with the assumption that A(h) is a "smooth" function of h, i.e., sufficiently many derivatives of A(h) exist for h=0, Taylor expansion yields, $$A(h) = A + a_1 h + a_2 h^2 + \ldots + a_p h^p + O(h^{p+1}). \tag{3}$$

If k denotes the order of the method or function A(h), by definition, $$a_1 = a_2 = \ldots a_{k-1} = 0, \tag{4}$$

and thus $$A(h) = A + a_k h^k + a_m h^m + O(h^{m+1}), \tag{5}$$

where the possibility $$a_{k+1} = a_{k+2} = \ldots = a_{m-1} = 0 \tag{6}$$

has been accommodated for.

Now let $h_1$ and $h_2$ be two given h-values—specifically, for the purposes of this application, $$h_1 = 2h_2. \tag{7}$$

From (3), $$A(h_1) = A + a_k h_1^k + a_m h_1^m + O(h_1^{m+1})$$

$$A(h_2) = A + a_k h_2^k + a_m h_2^m + O(h_2^{m+1}) \tag{8}$$

It follows that the $a_k$-term can be eliminated by multiplying the second equation with $(h_1/h_2)^k = \alpha^k$ and subtracting:

$$A = \frac{\alpha^k A(h_2) - A(h_1)}{\alpha^k - 1} + a_m \frac{\alpha^m - \alpha^k}{\alpha^k - 1} h_2^m + O(h_2^{m+1}) \tag{9}$$

or, since $\alpha=2$, the $k^{th}$ order Richardson extrapolation is given by $$A(h_2, h_1) = A(h_2) + \frac{A(h_2) - A(h_1)}{2^k - 1}. \tag{10}$$

Note that the $k^{th}$ order Richardson extrapolation results in an $m^{th}$ order approximation of A. Thus, Richardson extrapolation may be repeated, this time to $m^{th}$ order, for even higher order approximations of A.

Consider next how Richardson extrapolation may be employed for highly precise derivative estimates in the evaluation of the clamped cubic spline. Forward Taylor approximation of a function f(x) around the point $x_i$ yields $$f(x_i + h) = f(x_i) + hf'(x_i) + \frac{1}{2}h^2 f''(x_i) + \frac{1}{6}h^3 f'''(c), \tag{11}$$

where
$c \in [x_i; x_i+h]$.

Backward Taylor approximation of a function f(x) around the point $x_i$ yields $$f(x_i - h) = f(x_i) - hf'(x_i) + \frac{1}{2}h^2 f''(x_i) - \frac{1}{6}h^3 f'''(\overline{c}), \tag{12}$$

where
$\xi \in [x_i-h; x_i]$.

Subtracting (12) from (11) eliminates even order derivatives, i.e., $$f(x_i + h) - f(x_i - h) = 2hf'(x_i) + \frac{1}{6}h^3 f'''(\xi), \tag{13}$$

where
$\xi \in [x_i-h; x_i+h]$.

It follows that $$f'(x_i) = \frac{f(x_i + h) - f(x_i - h)}{2h} + O(h^2). \tag{14}$$

For fixed $x_i$, introducing the compact notation $$f(x_i + jh) \equiv f_j, \; j = \ldots -2, -1, 0, 1, 2, \tag{15}$$

and performing second order Richardson extrapolation of (14) according to (10) yields $$f'_0 = \frac{f_{-2} - 8f_{-1} + 8f_1 - f_2}{12h} + O(h^4). \tag{16}$$

Analogously, $$f'_1 = \frac{f_{-1} - 8f_0 + 8f_2 - f_3}{12h} + O(h^4). \tag{17}$$

Performing Richardson extrapolation of (16) and (17), this time to fourth order, yields $$f'_0 = \frac{-f_{-4} + 40f_{-2} - 256f_{-1} + 256f_1 - 40f_2 + f_4}{360h} + O(h^6), \quad (18)$$

and $$f'_1 = \frac{-f_{-3} + 40f_{-1} - 256f_0 + 256f_2 - 40f_3 + f_5}{360h} + O(h^6), \quad (19)$$

respectively. The $O(h^6)$ term is a remainder or error term. Because h has a value that is less than one, the term vanishes since h is being raised to the sixth power. In a practical sense, and as will be demonstrated shortly, the error is sufficiently small for hi-fidelity applications.

It follows from equations (18) and (19) that calculating precise derivative estimates can be viewed as a filtering task. Specifically, (18) and (19) show that the task may be performed by an anti-symmetric FIR filter with impulse response $$h(z) = \frac{1}{360}(1 - 40z^{-2} + 256z^{-3} - 256z^{-5} + 40z^{-6} - z^{-8}). \quad (20)$$

To explain the above process in simple terms, the above approach attempts to provide reasonably accurate estimates of the derivatives by looking at surrounding information. The exponents of z reflect delay (−6 means six delay elements ago in the signal buffer of FIG. 8, for example). The constant factors 1, 40 and 256 are mere multiplication terms. In the described embodiments, as shown in FIG. 9, only two sets of 3 (m1, m2 and m3) multiplication blocks are needed for implementing the algorithm of equation (20).

Referring to FIG. 8, a block diagram of the "Signal Buffer" appropriate for calculating derivative estimates using fourth order Richardson extrapolation is shown according to one embodiment of the present invention. Notice from equations (18), (19), and (20) a total of 10 signal values are needed to estimate the derivatives $f'_0$ and $f'_1$. Thus, as shown in FIG. 8, the "Signal Buffer" block consists of 9 registers to hold the samples $f_5, \ldots, f_4$.

Table 2 (below) shows algorithm details of the "ACC" block of FIG. 7. This block is driven by the 352.8 kHz sampling clock of the intermediate signal. The block maintains a modulo-147 accumulator, which is incremented by 20 during each cycle. Generally, an overflow occurs whenever addition of the value of 20 is added to an amount within the accumulator which is initialized to zero but maintains a remainder from a previous overflow condition. For example, in a first pass, the accumulator is set to "0". After the 7th addition of the value "20" the total value is still only 140. After the 8th addition of the value "20", however, the accumulator value is 160 which is an overflow condition with a remainder of "13" which is equal to 160−147. For the next pass, the accumulator starts with the overflow remainder, 13, and adds the value of "20" thereto as the process continues.

It can be shown that overflow of this accumulator indicates that a new output sample should be generated. Overflow occurs at an average rate of 48 kHz, corresponding to the desired output sampling rate. The signal "trig" is asserted when overflow occurs, indicating that the various processing blocks of FIG. 7 must complete a processing cycle. The interpolation point, i.e., the point in the interval between $x_0$ and $x_1$ where the signal value is to be estimated, is found via a 20-entry look-up table (LUT).

TABLE 2

Operation of ACC

ACC Operation
set acc = 0;
    lutPointer = 0;
    loop
        acc = (acc + 20) modulo 147;
        trig = carry;
        if trig
            lutPointer = (lutPointer + 1) modulo 20;
            x = LUT(lutPointer);
        end
    end FIG. 9 is a functional block diagram of the derivative estimation block according one embodiment of the invention. The symmetry of the Richardson extrapolation indicated by (20) can be exploited to reduce the number of multiplies to 3 rather than 6. These multiplies are shown as $m_1$, $m_2$, and $m_3$ and are found by rewriting (20) as $$h(z) = \frac{1}{360}(1 - z^{-8}) + \frac{40}{360}(z^{-6} - z^{-2}) + \frac{256}{360}(z^{-3} - z^{-5}). \quad (21)$$

Generally, the derivative estimation block of FIG. 9 calculates derivatives in the end points. The operation of FIG. 9 is an implementation of formulas 18 and 19. As may further be seen, only three multipliers are necessary, namely, 1, 40, and 256. The outputs are estimates of the signal at endpoints $x_0$ and $x_1$.

The circuit of FIG. 10 produces estimates of derivatives in the end points (the two points that straddle a sampling point at the desired (new) sampling rate.

FIG. 10 is a functional block diagram of the CCS coefficient calculation block that shows the details of the calculation of the CCS coefficients, according one embodiment of the invention. The arithmetic indicated in this figure directly follows from equation (2). The factors of 2 and 3 are implemented as a left-shift and a left-shift and add, respectively, and are thus not considered multiplications in the described embodiment. The CCS coefficient calculation block receives the two buffered values $f_0$ and $f_1$ as well as the derivative estimate values $f_{p0}$ and $f_{p1}$.

FIG. 11 shows the details of the CCS evaluation block of FIG. 7. As may be seen, the CCS evaluation block receives the four polynomial values $a_0-a_3$ as well a (x) from the Accumulator as described herein.

The method of polynomial evaluation adopted here is referred to as Homer's method. This method is arrived at by noting that the cubic polynomial of equation (1) may be re-written as $$f(x) = (((a_3x) + a_2)x + a_1)x + a_0. \quad (22)$$

The advantages of Homer's method are a reduced number of multiplications necessary to evaluate the polynomial and typically more well balanced intermediate results. Thus, the circuit of FIG. 11 implements equation (22) and produces a function output (magnitude of the random signal) at a time value of (x) which is the sampling point according to the desired sampling rate. Stated differently, the CCS evaluation block evaluates the function and produces a result at the desired sampling rate sampling times.

FIGS. 12A and 12B are flow charts of a method of the present invention. More specifically, FIG. 12A is a flow chart that illustrates a method for near unity sampling according to one embodiment of the present invention. Initially, the inventive embodiment includes receiving and up-sampling digital data representing a continuous waveform signal, the digital data having a first sampling rate (step 500) and filtering the upsampled data (step 502). The inventive method further and optionally includes receiving and up-sampling the upsampled data to produce twice upsampled data and filtering the twice upsampled data (step 504). In the described embodiments, the invention further optionally includes receiving and up-sampling by a factor of two the twice upsampled data to produce thrice upsampled data and filtering the thrice upsampled data (step 506). As an alternative to upsampling by a total factor of eight times over three upsampling steps, one may upsample by a factor of 8 (or to the preferred upsampled amount) in one step. One advantage of utilizing multiple steps, however, relates to filter design and complexity to block images created from each increase in sampling rate. Larger upsample step sizes require sharper filters as is known by one of average skill in the art. Finally, the inventive embodiment of FIG. 12A includes producing estimated derivative values, producing coefficient values and producing data with a decimated data sampling rate from a clampled cubic spline (CCS) interpolator to produce data at the second sampling rate wherein a ratio defined by the first and second data sampling rates is near unity (step 508).

FIG. 12B is a flow chart that illustrates a method for upsampling digital data representing a continuous waveform signal, the digital data having an initial sampling rate, wherein the up-sampler produces upsampled and filtered data an upsampled rate (step 510). Thereafter, the inventive method includes receiving data at the upsampled rate, and determining a value of (x), the sampling point at the desired sampling rate, and further producing a trigger at the sampling points at the desired sampling rate (step 512). Additionally, the embodiment of the inventive method further includes receiving the upsampled and filtered data at the upsampled rate, the signal buffer for producing buffered samples that is N samples wide wherein N is a value determined by a Richardson formulation for generating derivative estimates (step 514). The previous step facilitates producing at least two derivative estimates based upon the buffered samples (step 516) and therefore producing polynomial coefficient values based upon the at least two derivative estimates and upon at least two select buffered samples produced by the signal buffer (step 518).

FIG. 13 shows the magnitude response in dB of the sampling rate converter in the frequency range 0–30 kHz. It demonstrates the flatness of the passband as well as the steepness of the transition band. As stated before, the passband corresponds to the frequency range 0–20 kHz, whereas the transition band is the frequency range 20 kHz–24 kHz. FIG. 14 shows a close-up of FIG. 13.

FIG. 15 shows the typical ripple of the passband magnitude response. Notice that this plot is a function of the passband magnitude response of all three lowpass filters, i.e., $LPF_1$, $LPF_2$, and $LPF_3$.

FIG. 16 shows a typical simulation result for one embodiment of the present invention. Specifically, FIG. 16 shows the output power spectral density (PSD) in units of decibel relative to the carrier (dBc) for a 15 kHz sinusoidal input signal. The simulated signal-to-noise-and-distortion ratio (SNDR) is 105 dB and the spurious-free dynamic range (SFDR) is better-than 108 dB.

FIG. 17 shows a block diagram of the scheme employed to evaluate the SNDR and SFDR. The digital input sinusoid of known frequency enters the sampling rate converter, here labeled x[n]. The converter output, labeled y[n], is analyzed by first subtracting an estimate of the input signal x[n] and then performing a fast fourier transform (FFT) to arrive at the power spectral density of the error signal. This process continues in a feedback loop until the error signal power is minimized, resulting in an optimal estimate of the signal x[n].

FIG. 18 shows simulated SNDR and SFDR vs. frequency of the sinusoidal input signal x[n]. Better-than 96 dB SNDR and 100 dB SFDR is observed over the audio frequency band.

FIG. 19 shows the simulated magnitude response of the sampling rate converter found as the ratio of output signal amplitude and input signal amplitude. It is in agreement with the frequency response plot of FIG. 15.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

What is claimed is:

1. A sampling rate converter for altering an initial sampling rate to a desired sampling rate resulting in near-unity fractional sampling rate alteration, comprising:
    an interpolator for receiving and up-sampling digital data representing a continuous waveform signal, the digital data having a first sampling rate, wherein the interpolator produces upsampled and filtered data at a second rate;
    a clamped cubic spline (CCS) intepolator for producing down sampled data based on the upsampled and filtered data wherein a ratio defined by the first and second data rates is near-unity; and
    wherein the CCS intepolator implements a cubic polynomial in logic, and further wherein the CCS interpolator includes:
        derivative estimation block for producing derivative estimates of a data sequence;
        CCS coefficient calculation block for producing coefficient values of the cubic polynomial based on the derivative estimates and a buffered sequence of samples; and
        CCS evaluation block for producing the down sampled data based upon the derivative estimates, the coefficient values of the cubic polynomial and a specified value of time, x, and further based upon a trigger to produce the down sampled data.

2. The sampling rate converter of claim 1 further including a buffer for producing the buffered sequence of samples of a sample stream forming the digital data wherein the buffered sequence of samples are produced to the derivative estimation block and wherein the buffered sequence of samples are based upon the digital data.

3. The sampling rate converter of claim 1 further including a buffer for producing a buffered sequence of samples of a sample stream forming the digital data wherein select buffered sequence sample values are produced to the coefficient calculation block and wherein the select buffered sequence of samples are based upon the digital data.

4. The sampling rate converter of claim 1 wherein the interpolator comprises a first sampling doubler for producing a first doubled sampling rate based on the digital data and a first low pass filter for digitally filtering the first doubled sampling rate.

5. The sampling rate converter of claim 4 wherein the interpolator comprises a second sampling doubler for producing a second doubled sampling rate based on the digitally filtered first doubled sampling rate and a second low pass filter for digitally filtering the second doubled sampling rate.

6. The sampling rate converter of claim 5 wherein the interpolator comprises a third sampling doubler for producing a third doubled sampling rate based on the digitally filtered second doubled sampling rate and a third low pass filter for digitally filtering the third doubled sampling rate wherein the digital data has been upsampled a total of eight times at the output of the third doubled sampling rate.

7. The sampling rate converter of claim 5 wherein the interpolator comprises an Nth sampling doubler for producing an Nth doubled sampling rate based on the (Nth−1) doubled sampling rate and an Nth low pass filter for digitally filtering the (Nth−1) doubled sampling rate.

8. The sampling rate converter of claim 1 further including an accumulator that generates the trigger at approximate sampling points of the desired sampled rate based upon a received clock and upon a desired sampling rate.

9. The sampling rate converter of claim 8 wherein the CCS evaluation block receives a value of (x) and the trigger one of every seventh or eighth data value of the upsampled data and produces a sampling point estimate value upon receiving the trigger based upon the coefficient values.

10. The sampling rate converter of claim 8 wherein the CCS evaluation block receives the value of (x) and the trigger at a rate that is an integer value that is within ten percent of the value of the total number of times that the digital data was upsampled and produces the sampling point estimate value upon receiving the trigger to provide near-unity sampling rate conversion.

11. The sampling rate converter of claim 8 wherein the value of (x) is specified in a table and wherein the value of (x) is sequentially produced from values listed within the table.

12. The sampling rate converter of claim 11 wherein the specified table includes total of twenty entries.

13. A method for near-unity fractional sampling rate alteration, comprising:
  receiving and up-sampling digital data representing a continuous waveform signal, the digital data having a first sampling rate, wherein an interpolator produces upsampled data at a second sampling rate;
  filtering the upsampled data;
  producing decimated data from a clamped cubic spline (CCS) intepolator wherein a ratio defined by the first and second data rates is near-unity; and
  wherein the CCS interpolator implements a cubic polynomial in logic, and further wherein the CCS interpolator further performs the following steps:
    producing derivative values of estimates of a data sequence;
    producing coefficient values of the cubic polynomial; and
    receiving a trigger value and a specified value of (x) and producing data at a down sampled data rate based upon the derivative values, the coefficient values and the specified value of (x).

14. The method of claim 13 further including producing a buffered sequence of samples of a sample stream forming the digital data wherein the buffered sequence values are based upon the digital data.

15. The method of claim 13 further including producing a buffered sequence of samples of a sample stream forming the digital data wherein select buffered sequence sample values are produced to a coefficient calculation block and wherein the select buffered sequence of samples are based upon the digital data.

16. The method of claim 13 wherein the digital data is upsampled by a factor of two.

17. The method of claim 13 further including upsampling and digitally filtering the upsampled data to produce a twice upsampled data.

18. The method of claim 17 wherein the twice upsampled data is upsampled by a factor of two.

19. The method of claim 17 further including upsampling and digitally filtering the twice upsampled data to produce a thrice upsampled data.

20. The method of claim 19 wherein the thrice upsampled data is upsampled by a factor of two.

21. The method of claim 20 further including producing an Nth doubled sampling rate based on an (Nth−1) doubled sampling rate and digitally filtering the (Nth−1) doubled sampling rate.

22. The method of claim 13 further including generating a trigger at approximate sampling points of a desired sampling rate.

23. The method of claim 22 further including receiving a value of (x) and the trigger one of every seventh or eighth data value of the upsampled digital data and producing a sampling point estimate value upon receiving the trigger.

24. The method of claim 22 further including receiving a value of (x) and the trigger at a rate that is an integer value that is within ten percent of the value of the total number of times that the digital data was upsampled and producing the sampling point estimate value upon receiving the trigger to provide near-unity sampling rate conversion.

25. The method of claim 23 wherein the value of (x) is specified in a table and wherein the value of (x) is sequentially produced from values listed within the table.

26. The method of claim 25 wherein the specified table includes a total of twenty entries.

27. A sampling rate converter for altering an initial sampling rate to a desired sampling rate resulting in near-unity fractional sampling rate alteration, comprising:
  an interpolator for receiving and up-sampling digital data representing a continuous waveform signal, the digital data having an initial sampling rate, wherein the interpolator produces upsampled and filtered data an upsampled rate;
  an accumulator that receives a clock at the upsampled rate, the accumulator for determining approximate values of (x) wherein the approximate values of (x) relate to sampling points at the desired sampling rate wherein the accumulator further produces a trigger at the sampling points at the desired sampling rate;
  a signal buffer for receiving the upsampled and filtered data at the upsampled rate, the signal buffer for producing buffered samples that is N samples wide wherein N is a value determined by a Richardson formulation for generating derivative estimates;
  a derivative estimation block for producing at least two derivative estimates based upon the buffered samples;
  a coefficient calculation block for producing polynomial coefficient values based upon the at least two derivative estimates and upon at least two select buffered samples produced by the signal buffer;

a polynomial evaluation block for producing a function value representing an estimated sampling point value, the function value based upon the polynomial coefficient values and the approximate value of (x); and wherein the derivative estimation block, the coefficient calculation block and the polynomial evaluation block produce outputs based upon the trigger produced by the accumulator.

28. The sampling rate converter of claim 27 wherein the interpolator up samples the digital data eight times and decimates the upsampled data by a factor of 7.35.

29. The sampling rate converter of claim 28 wherein the original sampling rate is 44.1 kHz and wherein the desired sampling rate is 48 kHz.

30. The sampling rate converter of claim 29 wherein the signal buffer captures ten sampling points, the derivative estimation block produces two derivative estimates and the coefficient calculation block produces four coefficient values.

* * * * *